(12) United States Patent
Koh et al.

(10) Patent No.: US 7,358,811 B2
(45) Date of Patent: Apr. 15, 2008

(54) CMOS VARIABLE GAIN AMPLIFIER FOR CONTROLLING DB LINEAR GAIN

(75) Inventors: Jeongwook Koh, Seoul (KR);
 Hoon-tae Kim, Yongin-si (KR);
 Kyoung-sik Seol, Gyeongbuk (KR);
 Gyu-hyeong Cho, Daejeon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 156 days.

(21) Appl. No.: 11/339,523

(22) Filed: Jan. 26, 2006

(65) Prior Publication Data

US 2006/0181349 A1    Aug. 17, 2006

(30) Foreign Application Priority Data

Feb. 17, 2005    (KR) .................... 10-2005-0013258

(51) Int. Cl.
 *H03F 3/45* (2006.01)
(52) U.S. Cl. ..................................... 330/254
(58) Field of Classification Search ............... 330/254; 327/359
See application file for complete search history.

(56) References Cited

U.S. PATENT DOCUMENTS 6,157,257 A  *  12/2000  Murphy ..................... 330/252

FOREIGN PATENT DOCUMENTS

KR    1020040050589 A    6/2004

OTHER PUBLICATIONS

Francesco Carrara, et al. "High-Dynamic-Range Decibel-Linear IF Variable-Gain Amplifier With Temperature Compensation for WCDMA Applications", pp. 1-289-1292.

* cited by examiner

*Primary Examiner*—Steven J. Mottola
(74) *Attorney, Agent, or Firm*—Sughrue Mion, PLLC

(57) ABSTRACT

Provided is a complementary metal oxide semiconductor variable gain amplifier controlling a dB linear gain and a method of controlling the dB linear gain. The complimentary metal oxide semiconductor variable gain amplifier includes: first through fourth transistors differentially receiving first and second input voltages and amplifying the first and second input voltage using a predetermined gain; fifth and sixth transistors controlling a transconductance according to a control voltage to control the predetermined gain; and first and second resistors generating an output voltage having the predetermined gain according to an output current generated by the fifth and sixth transistors.

14 Claims, 5 Drawing Sheets

CMOS VARIABLE GAIN AMPLIFIER FOR CONTROLLING DB LINEAR GAIN

CROSS-REFERENCE TO RELATED APPLICATIONS

This application claims priority from Korean Patent Application No. 2005-13258 filed Feb. 17, 2005, in the Korean Intellectual Property Office, the disclosure of which is incorporated herein by reference.

BACKGROUND OF THE INVENTION

1. Field of the Invention

The present invention relates to a complementary metal oxide semiconductor (CMOS) variable gain amplifier (VGA). More particularly, the present invention relates to a CMOS VGA for dB-linearly controlling an output gain.

2. Description of the Related Art

Complementary metal oxide semiconductors (CMOSs) constituting mobile communication systems such as ultra wide band (UWB) systems are required to operate at a low power and to be compact. VGAs are necessarily used to maximize a dynamic range of an entire mobile communication system and vary a gain of a wide operation area so as to have a stable signal characteristic. In detail, such a VGA operates at a low voltage to consume a low power so as to uniformly maintain an output signal for an input range of an input signal more widely varying. As a result, the linearity of an output gain is improved and increased.

However, a CMOS VGA according to the prior art requires an additional exponential function generator to have a gain of an exponential function so as to control an output gain on a dB linear scale. For instance, a Gilbert Cell structure including a CMOS VGA suggested in "Design of Analog CMOS Integrated Circuits" by Razavi includes an exponential function generator.

FIG. 1 is a block diagram of an example of a CMOS VGA according to the prior art. Referring to FIG. 1, the CMOS VGA has a Gilbert Cell structure. The CMOS VGA having the Gilbert Cell structure includes an exponential function generator and a VGA core cell. An entire area of the CMOS VGA is 740 um*540 um, and the exponential function generator occupies an area of 220 um*540 um of the entire area.

FIG. 2 is a detailed circuit diagram of the CMOS VGA shown in FIG. 1. Referring to FIG. 2, the CMOS VGA increases a dynamic range of an input signal using a degenerate resistor M63. However, currents of transistors M61 and M62 must sharply vary to dB-linearly vary a gain of the entire CMOS VGA. Thus, the exponential function generator is required.

Accordingly, when a CMOS VGA is realized, a wide area is wasted by an exponential function generator. Thus, the CMOS VGA cannot be compact. Also, a large amount of power is consumed. As a result, the CMOS VGA cannot consume a small amount of power and operate at a low voltage.

SUMMARY OF THE INVENTION

Accordingly, the present general inventive concept addresses the above-mentioned problems, and an aspect of the present general inventive concept is to provide a CMOS VGA being small-sized, operating at a lower power, and controlling an output gain as a dB linear gain.

Another aspect of the present general inventive concept is to provide a CMOS VGA varying a gain of an input signal having a wide range at a low voltage according to a control voltage to operate in a wide band.

According to an aspect of the present invention, there is provided a complimentary metal oxide semiconductor variable gain amplifier including: first through fourth transistors differentially receiving first and second input voltages and amplifying the first and second input voltage using a predetermined gain; fifth and sixth transistors controlling a transconductance according to a control voltage to control the predetermined gain; and first and second resistors generating an output voltage having the predetermined gain according to an output current generated by the fifth and sixth transistors.

The first through fourth transistors and the fifth and sixth transistors may be N-channel metal oxide semiconductor transistors.

The first through fourth transistors may be disposed in parallel. Here, the first and second transistors may be configured in a differential input form, and the third and fourth transistors may be configured in a differential input form.

The first input voltage may be input to gate nodes of the first and third transistors, and the second input voltage may be input to gate nodes of the second and fourth transistors.

Drain nodes of the first and fourth transistors may be connected to each other so as to be connected to a source node of the fifth transistor, and drain nodes of the second and third transistors may be connected to each other so as to be connected to a source node of the sixth transistor.

If the first and second input voltages are larger than a first predetermined value, the control voltage may be set to be smaller than a second predetermined value, and if the first and second input voltages are smaller than the first predetermined value, the control voltage may be set to be larger than the second predetermined value.

According to another aspect of the present invention, there is provided a complimentary metal oxide semiconductor variable gain amplifier including: first through fourth transistors differentially receiving first and second input voltages and amplifying the first and second input voltages using a predetermined gain; fifth and sixth transistors controlling a transconductance according to a control voltage to control the predetermined gain; a control circuit differentially receiving the control voltage and a bias voltage to generate a mirror current; seventh and eighth transistors that are current source transistors supplying the mirror current generated by the control circuit to the first through fourth transistors; and first and second resistors generating an output voltage having the predetermined gain according to an output current generated by the fifth and sixth transistors.

The first through fourth transistors, the fifth and sixth transistors, and the seventh and eighth transistors may be N-channel metal oxide semiconductor transistors.

Source nodes of the first and second transistors may be connected to each other so as to be connected to the eighth transistor, and source nodes of the third and fourth transistors may be connected to each other so as to be connected to the seventh transistor.

The control circuit may include: a current source supplying a predetermined current; a twelfth transistor driven by the bias voltage so as to supply the current through the current source; an eleventh transistor driven by the control voltage so as to supply the current through the current source; a ninth transistor supplying the current supplied by the twelfth transistor to the eighth transistor; and a tenth transistor supplying the current supplied by the eleventh transistor to the seventh transistor.

The ninth through twelfth transistors may be N-channel metal oxide semiconductor transistors.

The ninth and tenth transistors may be configured in a current mirror form so as to generate a mirror current.

If the control voltage is smaller than the bias voltage, the current of the eighth transistor may be decreased and the current of the seventh transistor may be increased so as to decrease a voltage gain, and if the control voltage is larger than the bias voltage, the current of the seventh transistor may be decreased and the current of the eighth transistor may be increased so as to increase the voltage gain.

BRIEF DESCRIPTION OF THE DRAWINGS

The above aspects and features of the present invention will be more apparent by describing certain exemplary embodiments of the present invention with reference to the accompanying drawings, in which.

DETAILED DESCRIPTION OF THE EXEMPLARY EMBODIMENTS

Figure 1:
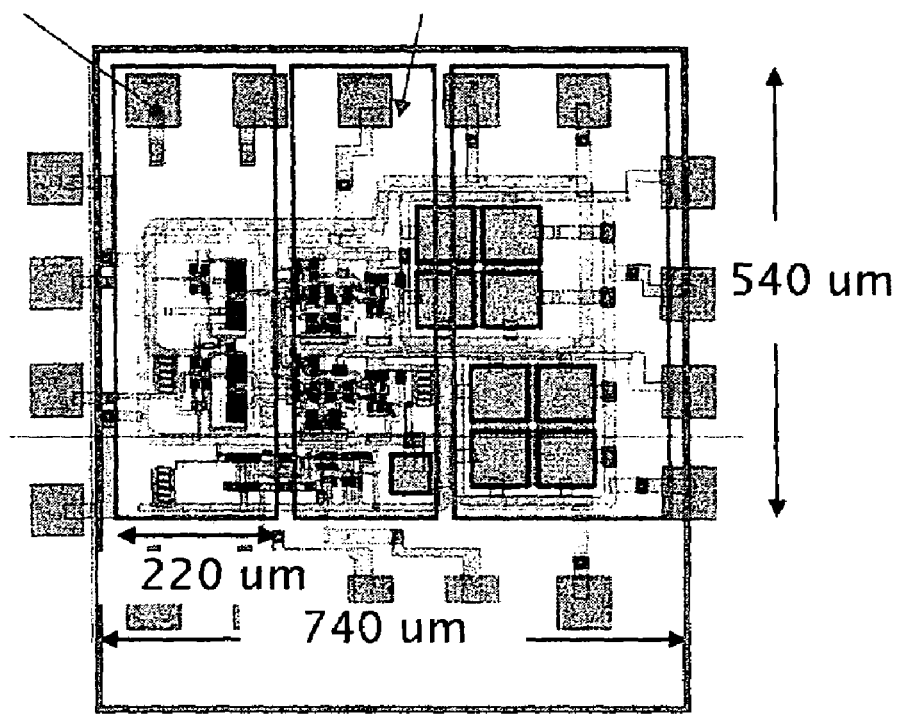
FIG. 1 is a detailed block diagram of an example of a CMOS VGA according to the prior art.
Figure 2:
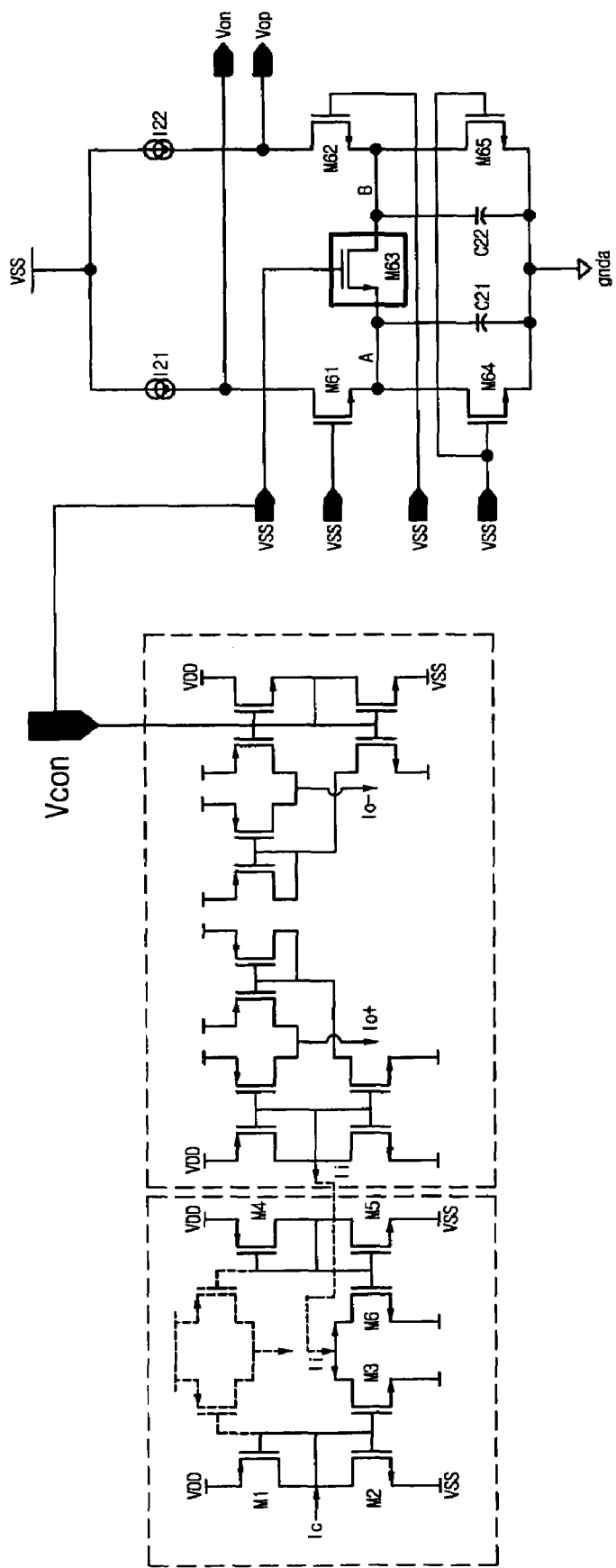
FIG. 2 is a detailed circuit diagram of the CMOS VGA shown in FIG. 1.

Certain exemplary embodiments of the present invention will be described in greater detail with reference to the accompanying drawings.

In the following description, same drawing reference numerals are used for the same elements even in different drawings. The matters defined herein are described at a high-level of abstraction to provide a comprehensive yet clear understanding of the invention. It is also to be noted that it will be apparent to those ordinarily skilled in the art that the present invention is not limited to the description of the exemplary embodiments provided herein.

Figure 3A:
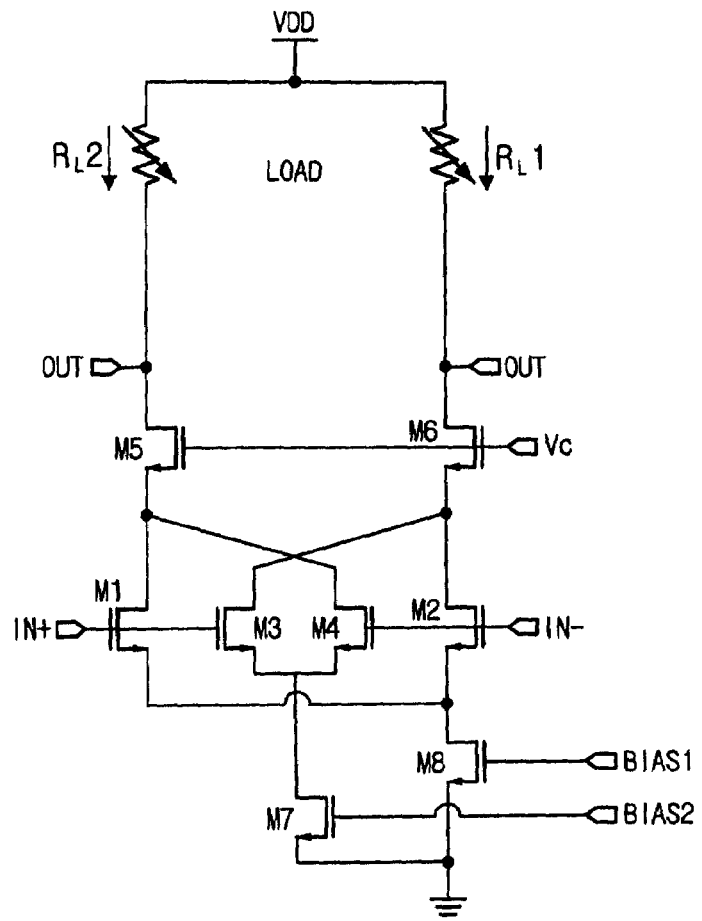
FIGS. 3A and 3B are circuit diagrams of a CMOS VGA according to an exemplary embodiment of the present invention.
Figure 3B:
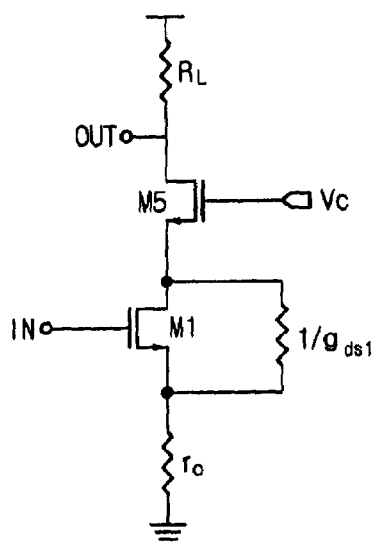

FIGS. 3A and 3B are circuit diagrams of a CMOS VGA according to an exemplary embodiment of the present invention. Referring to FIG. 3A, a first variable resistor $R_L1$ and an N-channel metal oxide semiconductor (NMOS) transistor M6 are connected to a power supply voltage VDD in series, and a second variable resistor $R_L2$ and an NMOS transistor M5 are connected to the power supply voltage VDD in series. The first and second variable resistors $R_L1$ and $R_L2$ calculate output currents as output voltages and may be prop resistors each having a predetermined size. Transconductances of the NMOS transistors M5 and M6 are adjusted according to a control voltage Vc so as to generate variable output currents. The variable output currents generated by the NMOS transistors M5 and M6 are changed into output voltages by the first and second variable resistors $R_L1$ and $R_L2$ and then output via output nodes OUT.

NMOS transistors M1, M2, and M8 are external differential transistors, and NMOS transistors M3, M4, and M7 are internal differential transistors. The NMOS transistors M1, M2, M3, and M4 are disposed in parallel. The NMOS transistor M1 driven by a first input voltage IN+ and the NMOS transistor M2 driven by a second input voltage IN− are configured in a differential input form. The NMOS transistor M3 driven by the first input voltage IN+ and the NMOS transistor M4 driven by the second input voltage IN− are configured in a differential input form. The first input voltage IN+ is input to gate nodes of the NMOS transistors M1 and M3, and the second input voltage IN− is input to gate nodes of the NMOS transistors M2 and M4. Drain nodes of the NMOS transistors M1 and M4 are connected to a source node of the NMOS transistor M5 in parallel, and drain nodes of the NMOS transistors M2 and M3 are connected to a source node of the NMOS transistor M6 in parallel.

The NMOS transistor M7 which is a current source transistor driven by a second bias BIAS2 is connected between source nodes and ground nodes of the NMOS transistors M3 and M4, and the NMOS transistor M8 which is a current source transistor driven by a first bias BIAS1 is connected between source nodes and ground nodes of the NMOS transistors M1 and M2.

FIG. 3B is an equivalent circuit diagram of a half of the CMOS VGA circuit shown in FIG. 3A. The half equivalent circuit includes the NMOS transistor M5 connected to a resistor $R_L$ in series, the NMOS transistor M1 including a drain node connected to a source node of the NMOS transistor M5, a resistor $1/g_{ds1}$ connected to the NMOS transistor M1, and a resistor $r_o$ connected to a source node of the NMOS transistor M1.

A voltage gain of the half equivalent circuit of the CMOS VGA is calculated as in Equation 1:

$$A_v = \frac{g_{m1} R_L}{1 + (g_{m1} + g_{ds1})r_o + \frac{g_{ds1}}{g_{m5}}} \approx \frac{R_L}{r_o} \frac{g_{m1}}{g_{m1} + g_{ds1}} \quad (1)$$

wherein $g_{m1}$ denotes a transconductance of the NMOS transistor M1, $g_{ds1}$ denotes a tranrsconductance between the drain and source nodes of the NMOS transistor M1, and $g_5$ denotes a transconductance of the NMOS transistor M5.

A voltage gain of the CMOS VGA of the present exemplary embodiment is calculated as in Equation 2:

$$A_v = \frac{R_L}{r_o}\left(\frac{g_{m1}}{g_{m1}+g_{ds1}} - \frac{g_{m4}}{g_{m4}+g_{ds4}}\right) = \frac{R_L}{r_o}\left(\frac{g_{m1}g_{ds4} - g_{m4}g_{ds1}}{(g_{m1}+g_{ds1})(g_{m4}+g_{ds4})}\right) \quad (2)$$

$$\approx \frac{R_L}{r_o} \frac{g_{m1}g_{ds4} - g_{m4}g_{ds1}}{g_{m1}g_{ds4} + g_{m4}g_{ds1}} = \frac{R_L}{r_o} \times g_{m1}g_{ds4} \times \frac{1+x}{1-x}$$

wherein $$x = -\frac{g_{m4}g_{ds1}}{g_{m1}g_{ds4}}, \text{ and } ex \approx \frac{1+x}{1-x}, -0.6 \leq x \leq 0.6.$$

As a result, the voltage gain can be amplified by the CMOS VGA of the present invention.

Figure 4:
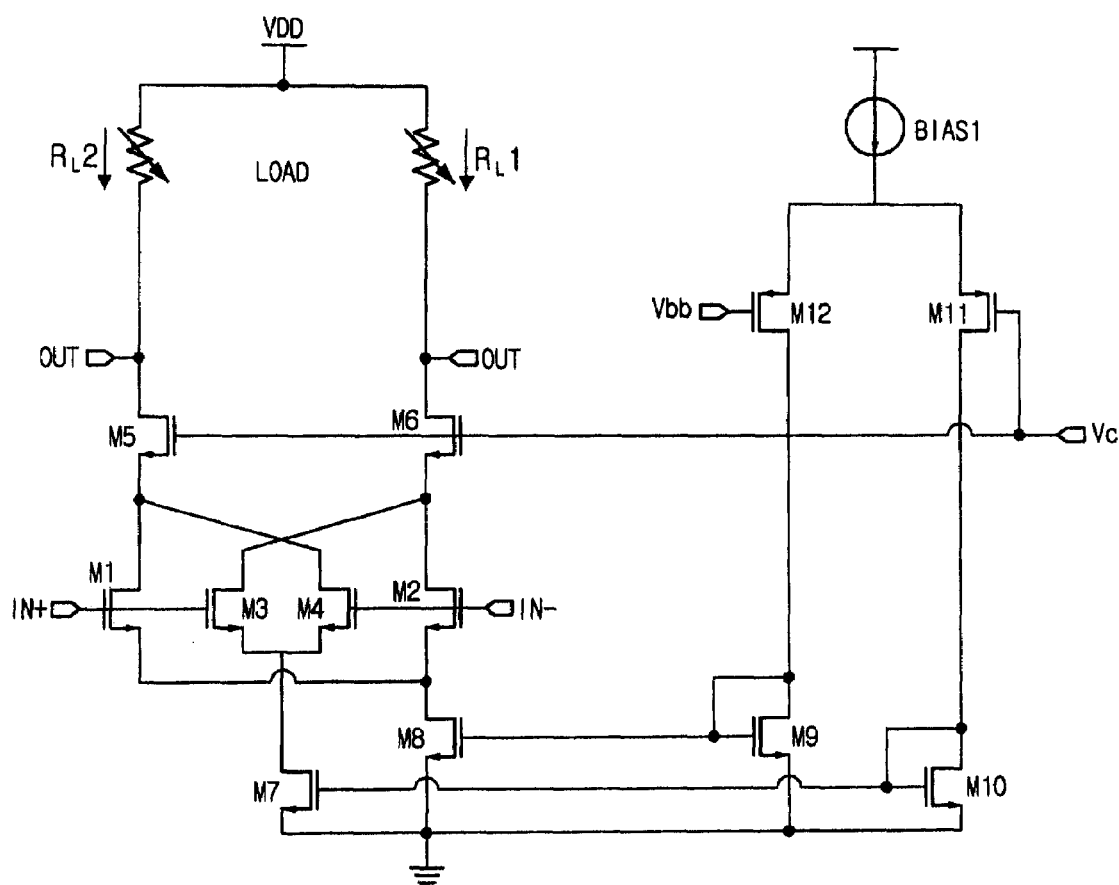
FIG. 4 is a circuit diagram of a CMOS VGA according to another exemplary embodiment of the present invention.

FIG. 4 is a circuit diagram of a CMOS VGA according to another exemplary embodiment of the present invention.

Referring to FIG. 4, the CMOS VGA additionally includes a control circuit controlling a gain in a wide range. The control circuit includes NMOS transistors M9, and M10, and PMOS transistors M11, and M12. A current source BIAS1 is connected to a power supply voltage VDD. The PMOS transistor M12 driven by a bias voltage Vbb and the PMOS transistor M11 driven by a control voltage Vc are configured in a differential form. The NMOS transistor M9 connected between drain and ground nodes of the PMOS transistor M12 and the NMOS transistor M10 connected between drain and ground nodes of the PMOS transistor M11 are configured in a current mirror form.

When the bias voltage Vbb and the control voltage Vc are complementarily applied, a current is supplied from the current source BIAS1 through the PMOS transistors M11 and M12 to the NMOS transistors M9 and M10 including input nodes configured in a current mirror form. The NMOS transistors M9, M10, M7, and M8 are separately driven by the current supplied to the NMOS transistors M9 and M10.

Transconductances of NMOS transistors M5 and M6 are controlled by the control voltage Vc so as to control a predetermined gain. Thus, output currents of the NMOS transistors M5 and M6 are generated by first and second input voltages IN+ and IN− differentially driving the NMOS transistors M1 and M2 and the NMOS transistors M3 and M4 to amplify the NMOS transistors M1, M2, M3, and M4 so that the NMOS transistors M1, M2, M3, and M4 have predetermined gains. The output currents are changed into output voltages having predetermined gains by first and second variable resistors $R_L1$ and $R_L2$ and then output via output nodes OUT. Here, the NMOS transistors M5 and M1 or M6 and M2 are cascaded so that the output nodes OUT have large output impedances, so as to increase a voltage gain.

The NMOS transistors M5 and M1 always operate in a saturation region depending on an intensity of the control voltage Vc while the NMOS transistors M1, M2, M3, and M4 supplied with the first and second input voltages IN+ and IN− operate in a linear region or the saturation region. In other words, if the intensity of the control voltage Vc is great, the NMOS transistors M5 and M1 and the NMOS transistors M1, M2, M3, and M4 all operate in the saturation region. If the intensity of the control voltage Vc is small, the NMOS transistors M5 and M1 operate in the saturation region while the NMOS transistors M1, M2, M3, and M4 operate in the linear region.

Accordingly, when large differential input voltages IN+ and IN− are applied, the CMOS VGA of the present invention amplifies the control voltage Vc so as to operate the NMOS transistors M5 and M1 or M6 and M2 that are cascaded, in the saturation region. When small differential input voltages IN+ and IN− are applied, the CMOS VGA decreases the control voltage Vc so as to operate the NMOS transistors M1, M2, M3, and M4 supplied with differential input signals in the linear region. As a result, a linearity can be maximized regardless of intensities of the differential input signals.

If the control voltage Vc is smaller than the bias voltage Vbb, a bias current of the NMOS transistor M8 is decreased by the control circuit, and a current is supplied to the NMOS transistors M10 and M7 through a path through which a current bias is to be supplied, so that the NMOS transistors M10 and M7 are driven. Thus, a bias current of the NMOS transistor M7 is increased, which decreases a voltage gain. If the control voltage Vc is larger than the bias voltage Vbb, the bias current of the NMOS transistor M7 is decreased, and a current is supplied to the NMOS transistors M9 and M7 through the path so that the NMOS transistors M9 and M7 are driven. Thus, the voltage gain is increased. Here, the current bias is uniformly and stably maintained by the NMOS transistors M7 and M8 or M3 and M4 having the same size. As a result, linearity and frequency characteristics are high. Also, the current bias compensates for a gain error.

Figure 5:
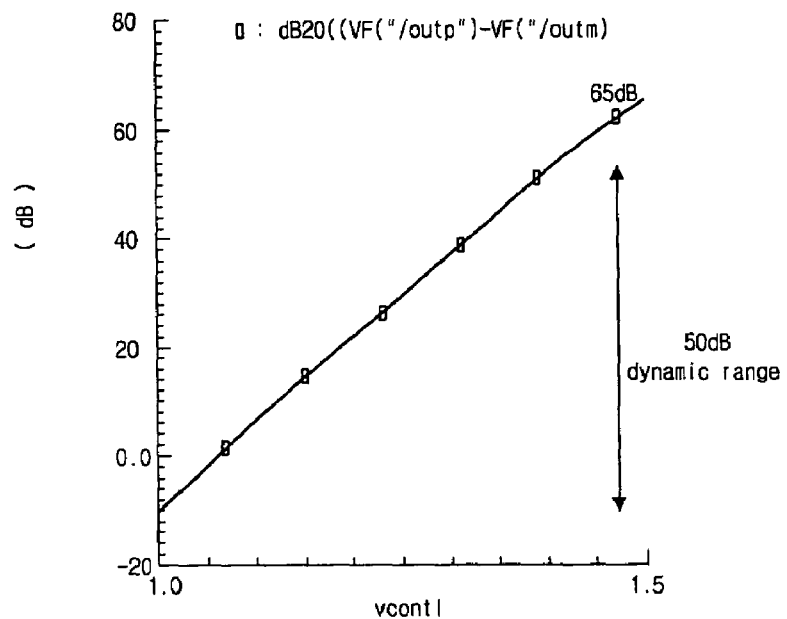
FIG. 5 is a graph illustrating an effect of a CMOS VGA according to an exemplary embodiment of the present invention.

FIG. 5 is a graph illustrating an effect of a CMOS VGA according to an exemplary embodiment of the present invention. Referring to FIG. 5, in a case where two CMOS VGAs according to an exemplary embodiment of the present invention are used for a UWB, a voltage gain varies with a variation in a control voltage. As shown in FIG. 5, the CMOS VGAs can secure a linear dynamic range of 50 dB with the variation in the control voltage.

Figure 6:
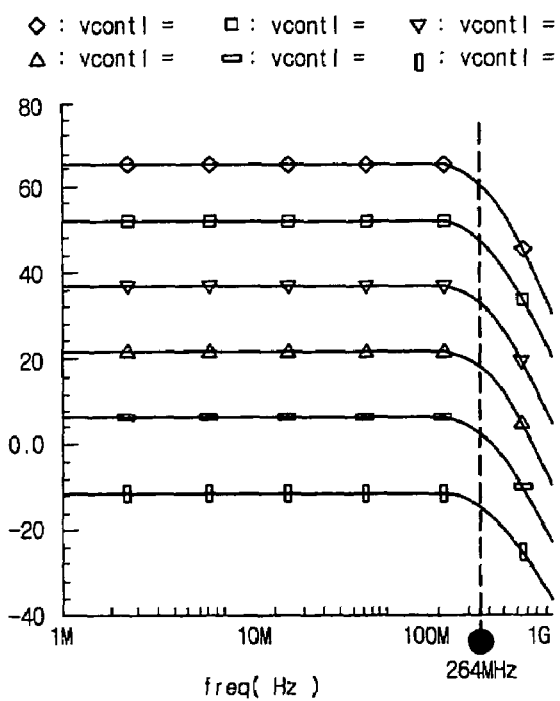
FIG. 6 is a graph illustrating an effect of a CMOS VGA according to an exemplary embodiment of the present invention.

FIG. 6 is a graph illustrating an effect of a CMOS VGA according to an exemplary embodiment of the present invention. Referring to FIG. 6, in a case where two CMOS VGAs according to an exemplary embodiment of the present invention are used for a UWB, a voltage gain varies with a variation in a frequency. As shown in FIG. 6, although the frequency varies, the CMOS VGAs can uniformly maintain the voltage gain up to 264 Mhz.

Table 1 below compares a CMOS VGA according to an exemplary embodiment of the present invention with a conventional CMOS VGA.

TABLE 1

|  | Conventional CMOS VGA | CMOS VGA of Present Invention | Gain |
|---|---|---|---|
| Area | 740 um * 540 um | 520 um * 540 um | Reduction of 30% |
| Power | 2 mW | 1.5 mW | Reduction of 25% |

As shown in Table 1, the CMOS VGA of the present invention does not require an exponential function generator differently from the conventional CMOS VGA. Thus, the area of the CMOS VGA of the present invention is reduced. As a result, the CMOS VGA of the present invention can be compact during integration and operate at a low power.

As described above, a CMOS VGA for controlling a dB linear gain according to an exemplary embodiment of the present invention can be compact, operate at a low power and in a wide band, and maximize the linearity.

The foregoing embodiments and advantages are merely exemplary in nature and are not to be construed as limiting the present invention. The present teaching can be readily applied to other types of apparatuses. Also, the description of the embodiments of the present invention is intended to be illustrative, and therefore it does not limit the scope of the claims. Alternatives, modifications, and variations of the exemplary embodiments described herein will be readily apparent to those skilled in the art.

What is claimed is:

1. A variable gain amplifier comprising:
two differential pairs of transistors comprising first through fourth transistors, each differential pair receiving a same input differential voltage, wherein the two differential pairs of transistors amplify first and second input voltages of the input differential voltage using a predetermined gain;
a transconductance control unit which controls transconductance of fifth and sixth transistors according to a control voltage to control the predetermined gain; and first and second resistors which generate an output voltage having the predetermined gain according to an output current generated by the fifth and sixth transistors.

2. The variable gain amplifier of claim 1, wherein first through fourth transistors of the two differential pairs and the fifth and sixth transistors are N-channel metal oxide semiconductor transistors.

3. The variable gain amplifier of claim 1, wherein first through fourth transistors of the two differential pairs are disposed in parallel, wherein a first differential pair of the two differential pairs comprises the first and second transistors configured in a differential input form, and a second differential pair of the two differential pairs comprises the third and fourth transistors configured in a differential input form.

4. A variable gain amplifier comprising:
first through fourth transistors which differentially receive first and second input voltages and amplify the first and second input voltages using a predetermined gain;
a transconductance control unit which controls transconductance of fifth and sixth transistors according to a control voltage to control the predetermined gain; and
first and second resistors which generate an output voltage having the predetermined gain according to an output current generated by the fifth and sixth transistors, wherein the first input voltage is input to gate nodes of the first and third transistors; and
the second input voltage is input to gate nodes of the second and fourth transistors.

5. The variable gain amplifier of claim 1, wherein:
drain nodes of the first and fourth transistors are connected to each other and connected to a source node of the fifth transistor; and
drain nodes of the second and third transistors are connected to each other and connected to a source node of the sixth transistor.

6. A variable gain amplifier comprising:
first through fourth transistors which differentially receive first and second input voltages and amplify the first and second input voltages using a predetermined gain;
a transconductance control unit which controls transconductance of fifth and sixth transistors according to a control voltage to control the predetermined gain; and
first and second resistors which generate an output voltage having the predetermined gain according to an output current generated by the fifth and sixth transistors,
wherein if the first and second input voltages are larger than a first predetermined value, the control voltage is set to be smaller than a second predetermined value, and if the first and second input voltages are smaller than the first predetermined value, the control voltage is set to be larger than the second predetermined value.

7. A variable gain amplifier comprising:
first through fourth transistors which differentially receive first and second input voltages and amplify the first and second input voltages using a predetermined gain;
a transconductance control unit which controls transconductance of fifth and sixth transistors according to a control voltage to control the predetermined gain;
a control circuit which differentially receives the control voltage and a bias voltage to generate a mirror current;
seventh and eighth transistors that are current source transistors which supply the mirror current generated by the control circuit to the first through fourth transistors; and
first and second resistors which generate an output voltage having the predetermined gain according to an output current generated by the fifth and sixth transistors.

8. The variable gain amplifier of claim 7, wherein the first through fourth transistors, the fifth and sixth transistors, and the seventh and eighth transistors are N-channel metal oxide semiconductor transistors.

9. The variable gain amplifier of claim 7, wherein:
source nodes of the first and second transistors are connected to each other and connected to the eighth transistor; and
source nodes of the third and fourth transistors are connected to each other and connected to the seventh transistor.

10. The variable gain amplifier of claim 7, wherein the control circuit comprises:
a current source supplying a predetermined current;
a twelfth transistor driven by the bias voltage to supply the current through the current source;
an eleventh transistor driven by the control voltage to supply the current through the current source;
a ninth transistor which supplies the current supplied by the twelfth transistor to the eighth transistor; and
a tenth transistor which supplies the current supplied by the eleventh transistor to the seventh transistor.

11. The variable gain amplifier of claim 10, wherein the ninth and tenth transistors are N-channel metal oxide semiconductor transistors.

12. The variable gain amplifier of claim 10, wherein the ninth and tenth transistors are configured in a current mirror form to generate a mirror current.

13. The variable gain amplifier of claim 7, wherein:
if the control voltage is smaller than the bias voltage, the current of the eighth transistor is decreased and the current of the seventh transistor is increased to decrease a voltage gain; and
if the control voltage is larger than the bias voltage, the current of the seventh transistor is decreased and the current of the eighth transistor is increased to increase the voltage gain.

14. The variable gain amplifier of claim 10, wherein the eleventh and twelfth transistors are P-channel metal oxide semiconductor transistors.

* * * * *